(12) United States Patent
Iguchi et al.

(10) Patent No.: US 9,698,297 B2
(45) Date of Patent: Jul. 4, 2017

(54) LIGHT-RECEIVING DEVICE AND METHOD FOR PRODUCING THE SAME

(71) Applicant: SUMITOMO ELECTRIC INDUSTRIES, LTD., Osaka (JP)

(72) Inventors: Yasuhiro Iguchi, Yokohama (JP); Youichi Nagai, Takarazuka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/952,582

(22) Filed: Nov. 25, 2015

(65) Prior Publication Data

US 2016/0155880 A1 Jun. 2, 2016

Related U.S. Application Data

(62) Division of application No. 14/154,861, filed on Jan. 14, 2014, now abandoned.

(30) Foreign Application Priority Data

Jan. 15, 2013 (JP) .................. 2013-004879

(51) Int. Cl.
| | | |
|---|---|---|
| H01L 31/109 | (2006.01) | |
| H01L 33/30 | (2010.01) | |
| H01L 31/00 | (2006.01) | |
| H01L 27/144 | (2006.01) | |
| H01L 31/0352 | (2006.01) | |
| H01L 31/103 | (2006.01) | |
| H01L 31/105 | (2006.01) | |
| H01L 31/18 | (2006.01) | |
| H01L 31/0304 | (2006.01) | |

(52) U.S. Cl.
CPC ........ H01L 31/109 (2013.01); H01L 27/1446 (2013.01); H01L 31/00 (2013.01);
(Continued)

(58) Field of Classification Search
CPC ................... H01L 31/00; H01L 31/035236
See application file for complete search history.

(56) References Cited

U.S. PATENT DOCUMENTS

| | | | |
|---|---|---|---|
| 5,208,823 A | 5/1993 | Patel | |
| 7,687,291 B2 * | 3/2010 | Charache | ............... B82Y 20/00 438/33 |

(Continued)

FOREIGN PATENT DOCUMENTS

JP 2001-144278 5/2001

OTHER PUBLICATIONS

Cohen et al.; "A Thin Film Indium Gallium Arsenide Focal Plane Array for Visible and Near Infrared Hyerpspectral Imaging"; Proceedings of the Leos '99, IEEE Lasers and Electro-Optics Society 1999, 12th Annual Meeting Conference; pp. 744-745.

(Continued)

Primary Examiner — Thao X Le
Assistant Examiner — Xia Cross
(74) Attorney, Agent, or Firm — Smith, Gambrell & Russell, LLP

(57) ABSTRACT

A method produces a light-receiving device by growing a light-receiving layer having an undoped multi-quantum well structure; growing a cap layer on the light-receiving layer while the cap layer is doped with a p-type impurity during its growth; growing a mesa structure; growing a protective film on surfaces of the mesa structure; and annealing to form a p-n junction. The mesa structure is defined by a surrounding trench. Alternatively, a selective growth mask can be formed on the light-receiving layer whereafter the cap layer is grown on the light-receiving layer by use of the mask. In the alternative, the p-n junction is formed by diffusing p-type impurity from a p-type contact layer of the cap layer through a concentration adjusting layer thereof to the light-receiving layer.

4 Claims, 12 Drawing Sheets

(52) U.S. Cl.
CPC .................. *H01L 31/03046* (2013.01); *H01L 31/035236* (2013.01); *H01L 31/035263* (2013.01); *H01L 31/105* (2013.01); *H01L 31/1035* (2013.01); *H01L 31/1844* (2013.01); *H01L 33/30* (2013.01); *Y02E 10/544* (2013.01)

(56) References Cited

U.S. PATENT DOCUMENTS

| | | | |
|---|---|---|---|
| 2004/0113156 A1* | 6/2004 | Tamura | H01L 33/42 257/79 |
| 2011/0240118 A1* | 10/2011 | Beatty | H01L 31/022425 136/256 |
| 2012/0032145 A1* | 2/2012 | Nagai | H01L 24/11 257/14 |
| 2012/0032147 A1* | 2/2012 | Nagai | A61B 5/14532 257/21 |

OTHER PUBLICATIONS

Itzler et al.; "Low-Noise Avalanche Photodiodes for Midwave Infrared (2-5 µm) Applications"; Princeton Lightwave Inc., Final Report, Aug. 14, 2005; 20 pages.

Khoshakhlagh et al., "Long-wave InAs/GaSb Superlattice Detectors Based on nBn and Pin Designs," IEEE J. Quantum Electron., vol. 46, No. 6 pp. 959-964.

* cited by examiner

LIGHT-RECEIVING DEVICE AND METHOD FOR PRODUCING THE SAME

CROSS REFERENCE TO RELATED APPLICATION

This application is a division of Ser. No. 14/154,861 filed on Jan. 14, 2014, which claims priority from JP2013-004879, filed Jan. 15, 2013, which is incorporated in its entirety herein by reference.

BACKGROUND OF THE INVENTION

1. Field of the Invention

The present invention relates to a light-receiving device and a method for producing the same.

2. Description of the Related Art

Living bodies, such as animals and plants, and substances, such as gases associated with the environment, have the characteristics of absorbing specific light in the infrared region including the near-infrared light with a wavelength of about 2 µm to 10 µm. In order to detect the absorption spectra of the substances such as gases associated with environments or organisms such as animals and plants, infrared light-receiving devices and infrared sensing devices including such infrared light-receiving devices are under development. In particular, in the near-infrared to infrared region, the photosensitivity to long-wavelength light is being improved. Here, the infrared light-receiving devices include a light-receiving layer composed of a III-V group compound semiconductor. In the light-receiving devices, a planar-type photodiode structure in which a p-n junction is formed by selective diffusion is used to reduce the dark current. In this planar-type photodiode structure, pixel isolation is achieved with a region in which impurity (for example, Zn impurity) is not diffused.

On the other hand, a mesa-type photodiode is also developed. In the mesa-type photodiode, a mesa structure is isolated by a mesa groove arranged surrounding the mesa structure. Non-Patent Literature 1 (Marshall J. Cohen; Michael J. Lange; Martin H. Ettenberg; Peter Dixon; Gregory H. Olsen. A Thin Film Indium Gallium Arsenide Focal Plane Array for Visible and Near Infrared Hyperspectral Imaging, Proceedings of the LEOS '99, IEEE Lasers and Electro-Optics Society 1999 12th Annual Meeting Conference, pp. 744-745) and Patent Literature (Japanese Unexamined Patent Application Publication No. 2001-144278) report two-dimensional near-infrared InGaAs image sensors including the mesa-type photodiodes in contrast with the planar-type photodiodes. Furthermore, Non-Patent Literature 2 (Mark Itzler. Low-Noise Avalanche Photodiodes for Midwave Infrared (2 to 5 µm) Applications, Princeton Lightwave Inc., Final Report, 14 Aug. 2005) reports a method for forming the mesa structure including the light-receiving layer having a type-II multi-quantum well (MQW) structure to extend sensitivity to longer wavelengths from the near-infrared region. Specifically, the Non-Patent Literature 2 reports wet etching with a phosphoric acid-based etchant to form the mesa structure.

SUMMARY OF THE INVENTION

However, the planar-type photodiode formed by selective diffusion has problems described below.
(1) When the light-receiving devices are formed on a large-diameter wafer, production efficiency can be enhanced. However, it is difficult to uniformly perform selective diffusion over the large-diameter wafer.
(2) If a region in which impurity is not diffused is not sufficiently ensured, it is difficult to separate pixels. Therefore, the region in which impurity is not diffused is formed with a sufficient area between the pixels for reliably separating the pixels. As a result, the area fraction of an opening or selectively diffused region occupying an incident surface (that is, so-called "fill factor") is reduced. Thus, sensitivity improvement is limited. In another respect, an increase in pixel pitch density is limited.

The mesa-type photodiodes have the advantage of having larger fill factors than the planar-type photodiodes. The mesa-type photodiodes have another advantage of having excellent controllability of positions of p-n junctions because p-n junctions are formed by epitaxial growth. The deviation of positions of p-n junctions changes the dependence of sensitivity and response speed on bias voltage, thus affecting the stability of properties of the photodiodes.

However, the mesa-type photodiode has a large leakage current that flows on a side surface of a mesa structure because of the exposure of a p-n junction at the side surface of the mesa structure. The leakage current causes the dark current of the photodiode. In particular, when the mesa structure is formed by dry etching, crystal damage occurs due to dry etching. The crystal damage due to dry etching tends to cause an increase in dark current. In general, dark current in the photodiode is required to be minimized. In order to reduce the dark current of a light-receiving device (photodiode), the light-receiving device may be cooled. Thus, a cooling mechanism, such as a Peltier element, may be provided to cool the light-receiving device. However, a light-receiving device having a cooling mechanism has demerits of increasing the device size and producing cost, for example. Therefore, a light-receiving element having a structure without a cooling mechanism, the structure by itself is a big feature of the light-receiving device. Even if a cooling mechanism is required, a low level of dark current makes it possible to reduce a cooling performance of the cooling mechanism, thereby reducing, for example, the size and cost of the cooling mechanism and the light-receiving device. It is thus important to form a mesa structure in which an edge of a p-n junction is not exposed to the atmosphere in order to reduce the dark current.

The position of a p-n junction is also important in addition to the non-exposure of the p-n junction. In general, dark current is proportional to an operating voltage (the absolute value of a reverse-bias voltage). Thus, a lower operating voltage results in further suppression of dark current. To extend a depletion layer from a p-n junction into a light-receiving layer, the operating voltage is applied between a pixel electrode and a ground electrode. When a p-n junction is provided in a light-receiving layer or at the boundary between an upper layer and a light-receiving layer, it is possible to extend a depletion layer into the light-receiving layer at a low operating voltage.

A light-receiving device according to a first aspect of the present invention includes (a) a light-receiving layer disposed on a substrate, the light-receiving layer having an undoped multi-quantum well structure; (b) a cap layer disposed on the light-receiving layer, the cap layer including a p-type semiconductor layer doped with a p-type impurity; (c) a mesa structure disposed on the substrate, the mesa structure including the cap layer; (d) a p-type region extending from the p-type semiconductor layer toward the light-receiving layer, the p-type region including the p-type impurity diffused from the p-type semiconductor layer in the cap layer in the mesa structure; (e) a p-n junction formed at an end of the p-type region; and (f) an electrode disposed on the cap layer of the mesa structure. The mesa structure is defined by a trench surrounding the mesa. The trench has a bottom that reaches the vicinity of an upper surface of the light-receiving layer. In addition, the p-n junction is located in the light-receiving layer or at the boundary between the light-receiving layer and the cap layer disposed on the light-receiving layer.

In the light-receiving device of the first aspect of the present invention, the p-n junction is formed at the end of the p-type region that is defined by the diffusion of the p-type impurity (Zn) from the cap layer in the mesa structure. In addition, the mesa structure is defined by the trench surrounding the mesa. Therefore, the p-n junction is separated using the mesa structure and the p-type region, thereby facilitating a reduction in the size of the light-receiving device, compared with a planar-type photodiode in the related art in which a p-n junction is formed and separated only by selective diffusion.

Furthermore, the bottom of the trench reaches the vicinity of an upper surface of the light-receiving layer. The p-n junction is located in the light-receiving layer or at the boundary between the light-receiving layer and the cap layer disposed on the light-receiving layer. Therefore, an edge of the p-n junction is not exposed to the atmosphere. In addition, the edge of the p-n junction is not exposed to an atmosphere in a growth chamber even during the production process. Thus, an impurity, such as oxygen, contained in the atmosphere and so forth does not adhere to the edge of the p-n junction, thereby suppressing an increase in dark current.

In addition, the p-n junction is located near the light-receiving layer. It is thus possible to extend a depletion layer to the light-receiving layer even at a low operating voltage. Hence, a lower operating voltage results in lower dark current.

The distribution of impurity concentration is controlled by the doping concentration of the p-type semiconductor layer in the cap layer. It is thus possible to increase the size of a substrate, compared with a selective diffusion method in the related art in which the selective diffusion is performed in a silica tube, for example. This enhances the mass productivity of the light-receiving device.

In the light-receiving device, the bottom of the trench reaches the vicinity of an upper surface of the light-receiving layer as mentioned above. That is, etching for forming the mesa structure is not performed to the depth of the multi-quantum well (MQW) structure. Thus, the crystallinity of the multi-quantum well structure is not degraded. A side surface of the light-receiving layer including the multi-quantum well structure is not exposed at forming the mesa structure, thereby providing the light-receiving layer exhibiting low dark current.

In addition, the p-n junction is formed at the end of the p-type region that is defined by the diffusion of the p-type impurity (Zn) from the cap layer. At the end of the p-type region, the concentration of the p-type impurity is equal to the background concentration of an n-type impurity in the light-receiving layer. Upon receiving light, a reverse-bias voltage is applied to the p-n junction to extend a depletion layer toward a portion of the light-receiving layer adjacent to the substrate. Light is absorbed in the depletion layer to generate electron-hole pairs. The size of the extension of the depletion layer from the p-n junction is inversely proportional to the concentration of the impurity. To allow the depletion layer to extend largely into the light-receiving layer, the light-receiving layer is not doped. Here, the impurity concentration of the light-receiving layer is a background concentration (n-type, $5 \times 10^{15}$ cm$^{-3}$ or less).

In the light-receiving device according to the first aspect of the present invention, the cap layer preferably includes a p-type contact layer doped with the p-type impurity and a concentration adjusting layer, the concentration adjusting layer being not doped or being doped with a lower concentration of an impurity than the p-type contact layer. The concentration adjusting layer is preferably disposed between the p-type contact layer and the light-receiving layer. The electrode is preferably disposed on the p-type contact layer.

In the light-receiving device according to the first aspect of the present invention, the p-type contact layer may be formed of one selected from an InGaAs layer and an InP layer. The concentration adjusting layer may be formed of at least one selected from an InGaAs layer and an InP layer. The p-type region may have a concentration of the p-type impurity of $5 \times 10^{16}$ cm$^{-3}$ or less at the boundary between the light-receiving layer and the cap layer disposed on the light-receiving layer.

In this case, it is possible to inhibit the degradation of the crystallinity of the light-receiving layer having the multi-quantum well (MQW) structure due to a predetermined concentration or more of the impurity.

In the light-receiving device according to the first aspect of the present invention, the light-receiving layer may include an undoped type-II multi-quantum well structure. Furthermore, the type-II multi-quantum well structure of the light-receiving layer may include InGaAs layers and GaAsSb layers alternately stacked that is formed on the substrate made of InP. Alternatively, the type-II multi-quantum well structure of the light-receiving layer may include GaSb layers and InAs layers alternately stacked. In this case, it is possible to provide a light-receiving device that is sensitive to the near-infrared region having a wavelength of about 3 μm to the mid-infrared region and that has low-dark-current characteristics.

A method for producing a light-receiving device according to a second aspect of the present invention includes the steps of (a) growing a light-receiving layer on a substrate, the light-receiving layer having an undoped multi-quantum well structure; (b) growing a cap layer on the light-receiving layer, the cap layer including a p-type semiconductor layer doped with a p-type impurity; (c) forming a mesa structure by etching the cap layer, the mesa structure being defined by a trench surrounding the mesa; (d) after the step of forming the mesa structure, forming a protective film on an upper surface and a side surface of the mesa structure; and (e) after the step of forming the protective film, forming a p-n junction in the light-receiving layer or at the boundary between the light-receiving layer and the cap layer by annealing with the upper surface and the side surface of the mesa structure covered with the protective film at a predetermined temperature. In the step of forming the mesa structure, the trench reaches the vicinity of an upper surface of the light-receiving layer. In the step of forming the p-n junction, the p-type impurity in the p-type semiconductor layer is diffused from the cap layer in the mesa structure to the light-receiving layer.

In the method according to the second aspect of the present invention, the cap layer including the p-type semiconductor layer doped with the p-type impurity is formed on the light-receiving layer by epitaxial growth. Furthermore, the cap layer is etched to form the mesa structure. In the subsequent step of forming the p-n junction, the p-type impurity is diffused from the p-type semiconductor layer in the cap layer toward the light-receiving layer by annealing at a predetermined temperature.

When an impurity is introduced into an epitaxial wafer from an external gas phase like selective diffusion, the pile-up of the impurity occurs at a heterointerface with the light-receiving layer, thereby causing the spike-like local change of the concentration. In contrast, in the foregoing method, the p-type impurity doped in the p-type semiconductor layer of the cap layer during epitaxial growth is diffused. This does not cause the pile-up of the impurity at the heterointerface between the cap layer and the light-receiving layer.

In the method for a light-receiving device according to the second aspect of the present invention, preferably, the cap layer includes a concentration adjusting layer formed on the light-receiving layer and a p-type contact layer formed on the concentration adjusting layer, the p-type contact layer being doped with the p-type impurity. Preferably, the concentration adjusting layer is not doped or is doped with a p-type or an n-type impurity at a lower concentration than that of the p-type contact layer. In the step of forming the p-n junction, the p-type impurity is preferably diffused from the p-type contact layer in the mesa structure to the light-receiving layer through the concentration adjusting layer.

In the method for a light-receiving device according to the second aspect of the present invention, preferably, in the step of growing the cap layer, the p-type semiconductor layer in the cap layer is grown while the p-type impurity is doped with a concentration gradually or stepwise increased with the lapse of growth time from the beginning of the growth. This prevents the degradation of the crystallinity of the multi-quantum well (MQW) structure due to the diffusion of the impurity with a concentration more than a predetermined concentration.

In the method for a light-receiving device according to the second aspect of the present invention, preferably, the light-receiving layer and the cap layer are grown at a growth temperature of 425° C. to 575° C. by a metal-organic vapor phase epitaxy method using metal-organic compounds for a III group source material and a V group source material.

The semiconductor layer constituting the MQW structure such as the GaAsSb layer in the light-receiving layer may cause phase separation at a high temperature to degrade the satisfactory crystallinity. Thus, the GaAsSb layer is grown using only the metal-organic sources, which are readily decomposed at a low temperature, at 425° C. to 575° C., thereby providing satisfactory crystallinity and preventing a reduction in the crystallinity of the GaAsSb layer.

A method for producing a light-receiving device according to a third aspect of the present invention includes the steps of (a) growing a light-receiving layer on a substrate, the light-receiving layer having an undoped multi-quantum well structure; (b) forming a selective growth mask on the light-receiving layer, the selective growth mask including an opening through which the light-receiving layer is exposed; (c) selectively growing a concentration adjusting layer and a p-type contact layer, in that order, on the light-receiving layer using the selective growth mask, the p-type contact layer being doped with a p-type impurity; and (d) forming a p-n junction in the light-receiving layer or at the boundary between the light-receiving layer and the concentration adjusting layer. The concentration adjusting layer is not doped or is doped with a p-type or an n-type impurity at a lower concentration than that of the p-type contact layer. In the step of forming the p-n junction, the p-type impurity doped in the p-type contact layer is diffused to the light-receiving layer through the concentration adjusting layer during growing the p-type contact layer. In this method, the edge of the p-n junction is not exposed to the atmosphere during the production. Furthermore, the p-n junction is separated by using the selective growth, thereby circumventing damage to walls of the mesa structure due to etching. It is thus possible to surely suppress the dark current of the light-receiving device.

BRIEF DESCRIPTION OF THE DRAWINGS

FIG. 4A illustrates a state in which after an insulating film is formed on a stacked semiconductor layer, a resist mask is formed on the insulating film and subjected to dry etching.

FIG. 4B illustrates a state during the dry etching. FIG. 4C illustrates a state in which after an insulating film is formed on the entire surface of a wafer including a mesa trench, a resist mask having an opening at an end portion of a chip is formed and subjected to dry etching. FIG. 4D illustrates a state in which the resist mask and the insulating film located at the end portion of the chip are removed.

FIG. 10A illustrates a stage at which a light-receiving layer is formed on a buffer layer. FIG. 10B illustrates a stage at which a selective growth mask is formed on the light-receiving layer. FIG. 10C illustrates a stage at which selective growth layers are grown while an impurity is selectively diffused. FIG. 10D illustrates a stage at which pixel electrodes are formed on the selective growth layers.

DESCRIPTION OF THE PREFERRED EMBODIMENTS

Figure 1:
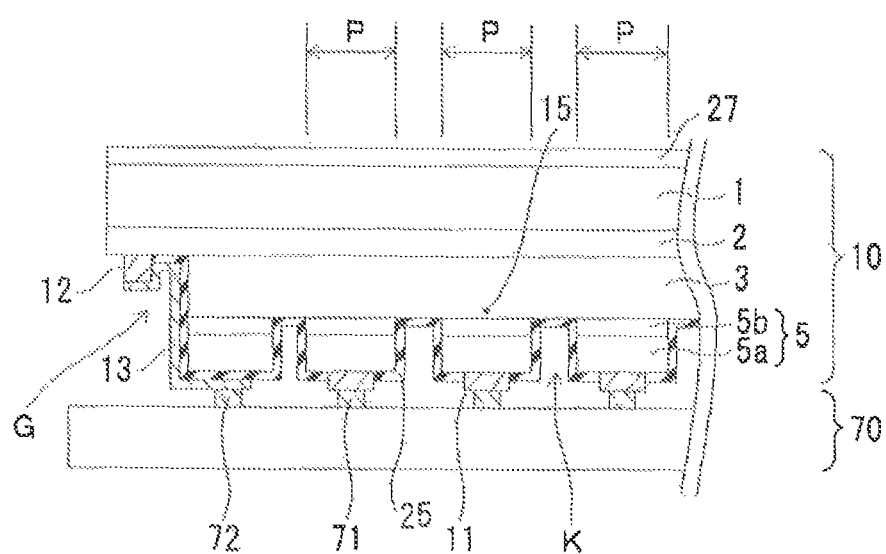
FIG. 1 is a cross-sectional view of a light-receiving device and a sensing apparatus according to a first embodiment.

Findings of the present invention can be readily understood by considering the following detailed description with reference to the attached drawings illustrated. A light-receiving device, a method for producing the same, and a sensing apparatus according to embodiments of the present invention will be described with reference to the attached drawings. The same components are designated using the same reference numerals, when possible.

First Embodiment

FIG. 1 illustrates a sensing apparatus 50 including a light-receiving device 10 and a read-out integrated circuit (ROIC) 70 connected to the light-receiving device 10. The light-receiving device 10 has a stacked semiconductor layer described below, (InP substrate 1/n-type InP buffer layer 2/light-receiving layer 3/cap layer 5). The light-receiving layer 3 includes an undoped multi-quantum well (MQW) structure in which well layers and barrier layers are alternately stacked. Especially, the light-receiving layer 3 includes an undoped type-II multi-quantum well (MQW) structure. The light-receiving layer 3 including the type-II multi-quantum well (MQW) structure is explained hereinafter.

The cap layer 5 includes a p-type InGaAs contact layer 5a and an InGaAs concentration adjusting layer 5b adjacent to the p-type InGaAs contact layer 5a. A pixel electrode 11 is formed on the p-type InGaAs contact layer 5a and is in ohmic contact with the p-type InGaAs contact layer 5a. Zinc (Zn) doped in the p-type InGaAs contact layer 5a as a p-type impurity diffuses into the InGaAs concentration adjusting layer 5b. In the InGaAs concentration adjusting layer 5b, zinc (Zn) impurity is distributed so as to have a concentration gradient decreasing toward the light-receiving layer. The concentration adjusting layer 5b may be formed of the foregoing InGaAs layer, an InP layer, or a composite layer formed of (InGaAs layer/InP layer). The p-type contact layer 5a may be formed of the foregoing InGaAs layer, an InP layer, or a composite layer formed of (InGaAs layer/InP layer). The p-type contact layer 5a has a concentration of a p-type impurity, such as zinc (Zn), of $1\times10^{18}$ cm$^{-3}$ or more so as to form an ohmic contact with the pixel electrode 11. Impurity concentrations in the p-type contact layer 5a and the concentration adjusting layer 5b will be described in detail below in connection with a p-n junction 15.

The light-receiving layer 3 has a multi-quantum well (MQW) structure. Specifically, the light-receiving layer 3 has a type-II multi-quantum well (MQW) structure in which InGaAs and GaAsSb layers are alternately stacked. Each of the InGaAs layers has a thickness of 2 nm to 6 nm. Each of the GaAsSb layers has a thickness of 2 nm to 6 nm. The multi-quantum well structure has about 250 pairs to about 500 pairs. The light-receiving layer 3 has a thickness of 2 μm to 5 μm. The p-type contact layer 5a of the cap layers 5 has a thickness of 0.3 μm to 3 μm. The concentration adjusting layer 5b has a thickness of 0.05 μm to 2 μm. As illustrated in a second embodiment, the concentration adjusting layer 5b may be absent.

Pixels P are mechanically and structurally separated by a trench K of a mesa structure. To protect an edge portion of the mesa structure, a protective film 25 is formed on a top surface and a side surface of the mesa structure. The protective film 25 is also formed in the trench K of the mesa structure. The trench K of the mesa structure, the p-type contact layer 5a, and a ground electrode 12 are located at the edge portion. The trench K of the mesa structure, the p-type contact layer 5a, and the ground electrode 12 are covered with the protective film 25. Each of the pixel electrodes 11 of the light-receiving device 10 is electrically connected to a corresponding read-out electrode 71 provided in the ROIC 70 with a bump (not illustrated). A ground electrode 12 is formed on the n-type buffer layer 2 and is in ohmic contact with the n-type buffer layer 2. Furthermore, the ground electrode 12 is electrically connected to a ground electrode 72 with a bump (not illustrated) via a wiring electrode 13 which is arranged on a side surface of the edge portion and which extends to the top surface of the p-type contact layer 5a. The bump is arranged so as to face the ground electrode 72 of the ROIC 70. The pixel electrode 11 is composed of AuZn. The ground electrode 12 is composed of AuGeNi. The pixel electrode 11 and the ground electrode 12 may be composed of Pt—Ti—Au. As described above, the p-type contact layer 5a has an impurity concentration of $1\times10^{18}$ cm$^{-3}$ or more. The n-type buffer layer 2 may be doped with Si serving as an n-type impurity in an amount of $1\times10^{18}$ cm$^{-3}$ or more. When the pixels are two-dimensionally arranged, the backside of the InP substrate 1 may be defined as an incident surface. To increase responsivity, an antireflection coating 27 composed of, for example, SiON, may be arranged on the backside of the InP substrate 1. A complimentary metal-oxide semiconductor (CMOS)-containing multiplexer is used as the ROIC 70.

In the light-receiving device 10 according to this embodiment, a combination of the mesa structure and the impurity diffusion achieves the pixel separation and the pixel arrangement having a high fill factor. When the p-n junction is formed, the edge of the p-n junction is arranged in the light-receiving layer or at the upper boundary of the light-receiving layer (the upper surface of the light-receiving layer) without exposure to an atmosphere for a moment from the beginning of the production to the completion of a product. The edge of the p-n junction 15 is not exposed to the atmosphere from the beginning of the production to the completion of a product; hence, an impurity, such as oxygen, does not adhere to the edge of the p-n junction 15. No adhesion of oxygen or the like to the edge of the p-n junction 15 effectively serves to suppress dark current. Due to the position of the p-n junction, a depletion layer extends to the light-receiving layer 3 at a low operating voltage. The low operating voltage also contributes assuredly to suppress the dark current.

The mesa structure of the light-receiving device 10 according to this embodiment will be described below. As illustrated in FIG. 1, the trench K reaches the vicinity of the upper surface of the light-receiving layer 3. Regarding the trench of the mesa structure described above, the expression "the trench K reaches the vicinity of the upper surface of the light-receiving layer" indicates that when the depth position of the boundary between the light-receiving layer 3 and an upper layer (the concentration adjusting layer 5b in each of the cap layers 5 in FIG. 1) on the light-receiving layer 3 is defined as a reference depth position, the bottom of the trench is located at a position in a depth range of (a position in the upper layer away from the reference depth position by 1/10 of the thickness of the light-receiving layer 3) to (a position in the light-receiving layer 3 away from the reference depth position by 2/10 of the thickness of the light-receiving layer 3). Thus, the bottom of the trench K is located at a position in the concentration adjusting layer 5b of a corresponding one of the cap layers 5 away from the reference depth position by 10% or less of the thickness of the light-receiving layer 3. Alternatively, when the bottom of the trench K is located in the light-receiving layer 3, the depth position of the bottom of the trench K is limited to the inside of an upper portion of the light-receiving layer 3, the upper portion having a thickness of 20% or less of the thickness of the light-receiving layer 3. Accordingly, a near-infrared light-receiving device which includes the pixels P separated mechanically and structurally is obtained. In addition, in the near-infrared light-receiving device, excellent performances such as low dark current and high signal-to-noise ratio can be realized. With respect to pixel separation in the related art, the trench is arranged so as to extend substantially completely through the light-receiving layer. As a result, a side wall of the light-receiving layer is exposed to an atmosphere at the trench. Therefore, in the light-receiving device with the trench extending completely through the light-receiving layer, dark current is increased. In the embodiment, the trench K is formed so as to have the bottom which is located at a position in the upper layer away from the reference depth position by 10% or less of the thickness of the light-receiving layer or which are each located at a position in the upper portion of the light-receiving layer 3 away from the reference depth position by 20% or less of the thickness of the light-receiving layer 3. Therefore, the pixels P are separated without exposure of the p-n junction 15 to the outside air. The mesa structure is formed by forming the trench K surrounding the mesa structure, and then the mesa structure is covered with the protective film 25. An impurity (Zn) is diffused to form the final p-n junction 15. Specifically, the trench K is formed within the depth range described above. In the embodiment, a p-type impurity (Zn) doped in the p-type contact layers 5a is diffused toward the light-receiving layer 3. The p-type contact layers 5a is used as a diffusion source.

A method for forming the p-n junction 15 by impurity diffusion from the p-type contact layer 5a will be described below. In a planar-type light-receiving device using the selective diffusion of an impurity in the related art, pixels are separated by regions in which the impurity does not diffuse. In the selective diffusion, however, the impurity is diffused from opening portions not only in the depth direction but also in the lateral direction. This is a major obstacle to reducing the pixel pitch to increase the fill factor. In contrast, according to this embodiment, pixels are mechanically and structurally separated by the mesa structure, thereby resulting in a narrow pitch. According to the first embodiment, after forming the protective film 25 on the side surface and top surface of the mesa structure, the p-type impurity, such as Zn, in the p-type contact layers 5a is diffused by annealing to the upper surface of the light-receiving layer 3 or inside the light-receiving layer 3. Thus, the p-n junction 15 is accurately located at predetermined positions on the upper surface of the light-receiving layer 3 or in the upper portion of the light-receiving layer 3.

Figure 2A:
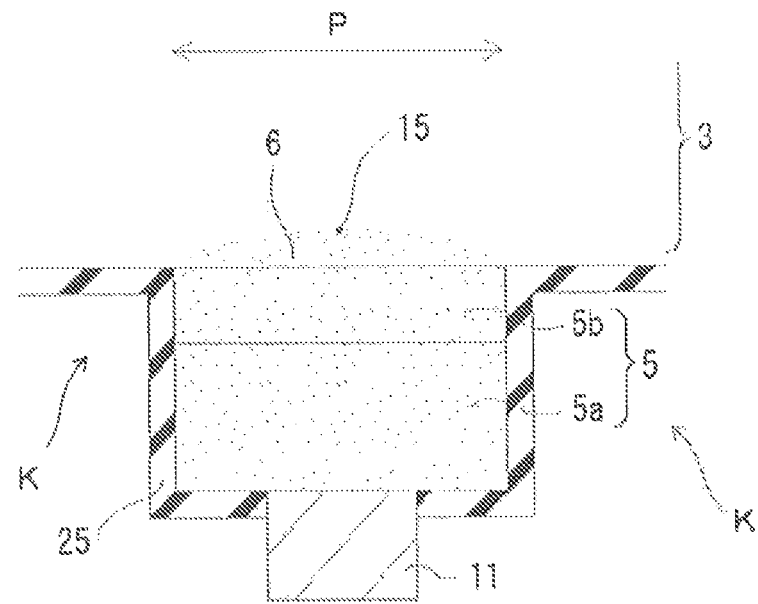
FIG. 2A is a partially enlarged view of a pixel of the light-receiving device illustrated in FIG. 1.
Figure 2B:
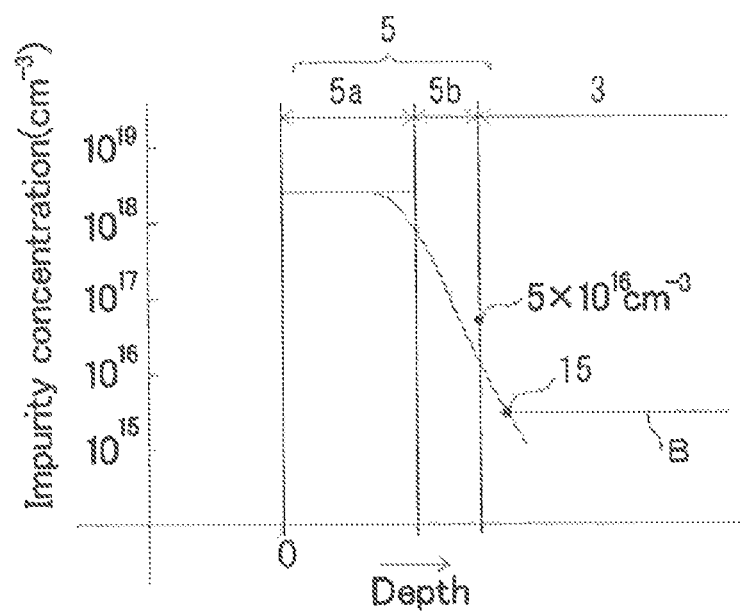
FIG. 2B illustrates the in-depth distribution of impurity concentration in the light-receiving device illustrated in FIG. 1.

FIG. 2A is a partially enlarged cross-sectional view of the pixel P illustrated in FIG. 1 and illustrates the distribution of Zn serving as a p-type impurity in a pixel P mechanically and structurally separated by the trench K of the mesa structure. FIG. 2B illustrates the in-depth distribution of the concentration of the impurity. Zinc (Zn) serving as a p-type impurity is diffused from the p-type contact layer 5a toward the light-receiving layer 3 by a driving force resulting from a concentration gradient, thereby forming a p-type region 6. An end of the p-type region 6 is located at a position which is inside the light-receiving layer 3 and in the vicinity of the upper surface of the light-receiving layer 3, thereby resulting in the formation of the p-n junction 15.

Referring to FIG. 2B, immediately after the epitaxial growth of the p-type contact layer 5a, the impurity is uniformly distributed (indicated by a dotted line) with high concentration in the p-type contact layer 5a. In the annealing process, the impurity is diffused toward the light-receiving layer 3. As a result, the impurity concentration at a corner portion of a high-concentration region in the p-type contact layer 5a is gradually reduced toward the light-receiving layer 3. In the concentration adjusting layer 5b disposed between the p-type contact layer 5a and the light-receiving layer 3, a distribution in Zn concentration has a large slope of (concentration/in-depth distance) in the depth direction. As described above, the concentration of the p-type impurity, such as Zn, may be set at a low concentration of $5 \times 10^{16}$ $cm^{-3}$ or less at the boundary between the light-receiving layer 3 and the concentration adjusting layer 5b because the concentration adjusting layer 5b is disposed between the p-type contact layer 5a and the light-receiving layer 3. This inhibits the degradation of the crystallinity of the type-II multi-quantum well structure constituting the light-receiving layer 3.

The p-n junction 15 is formed at a position (crossing position) at which the concentration of the p-type impurity at the end of the p-type region 6 is equal to the background concentration of an n-type impurity in the light-receiving layer 3. When the position of the p-n junction 15 is defined as a reference position, the p-type region 6 extending from the reference position to the p-type contact layer 5a has a high p-type impurity concentration. The light-receiving layer 3 is composed of an undoped semiconductor that has an n-type conductivity and a background concentration of the n-type impurity. Therefore, the concentration of the n-type impurity in a portion of the light-receiving layer 3 extending from the reference position toward the substrate 1 is equal to the background concentration. The background concentration of the n-type impurity in the portion of the light-receiving layer 3 extending from the reference position toward the substrate 1 is, for example, about $5 \times 10^{15}$ $cm^{-3}$ and is substantially constant. The p-type impurity in the p-type contact layer 5a, which serves as a diffusion source, is doped during growing the contact layer 5a. The p-type contact layer 5a serves as a diffusion source and the p-type impurity in the p-type contact layer 5a is diffused toward the light-receiving layer 3. In the method, steps of vacuum-sealing an epitaxial wafer in a silica tube or the like and selectively diffusing an impurity from the outside through a gas phase are not required. It is thus possible to improve the productivity by increasing the diameter of the semiconductor substrate.

When the light-receiving device 10 receives light, it is necessary to apply a predetermined operating voltage (the absolute value of a reverse-bias voltage) to the p-n junction 15 to extend a depletion layer into the light-receiving layer 3. As illustrated in FIG. 2, the p-n junction 15 is formed in the light-receiving layer 3 or at the boundary between the light-receiving layer 3 and the concentration adjusting layer 5b in the cap layer 5. In this case, even if a low reverse-bias voltage is applied to the light-receiving device 10, the depletion layer extends into the light-receiving layer 3.

As described above, in general, dark current is proportional to an operating voltage (the absolute value of a reverse-bias voltage). Thus, a lower operating voltage results in further suppression of the dark current. As illustrated in FIG. 2B, the portion of the light-receiving layer 3 extending from the reference position of the p-n junction 15 toward the substrate 1 has a low impurity concentration that corresponds to the n-type background concentration. On the other hand, a portion of the light-receiving layer 3 extending from the reference position toward the concentration adjusting layer 5b contains a p-type impurity with a high concentration. Thus, by applying a low operating voltage, the depletion layer is extended largely into the light-receiving layer 3. The operating voltage is applied between the pixel electrode 11 and the ground electrode 12. In this embodiment, the depletion layer is sufficiently extended in the light-receiving layer even at a low operating voltage, so that sufficient responsivity is provided. As described above, the reduction in operating voltage results in the suppression of the dark current.

Modified Embodiment

Figure 3A:
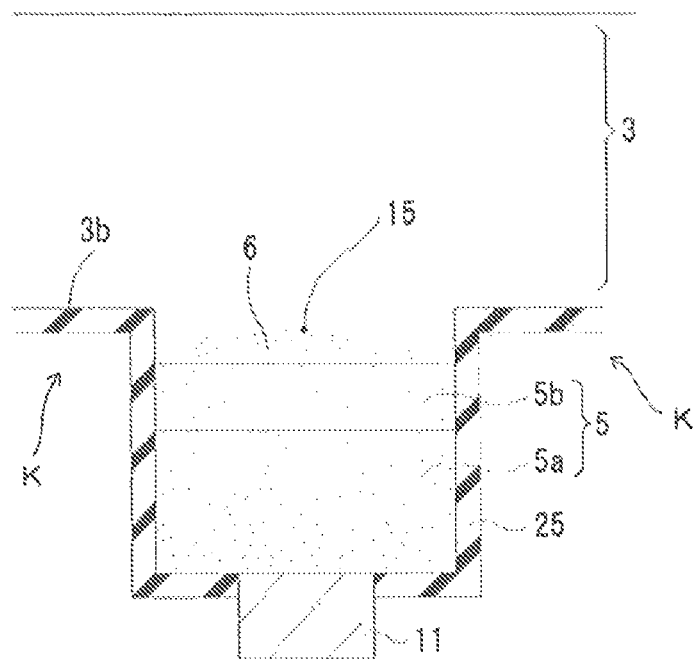
FIG. 3A is an enlarged view of a pixel in a modified embodiment of the light-receiving device illustrated in FIG. 1.
Figure 3B:
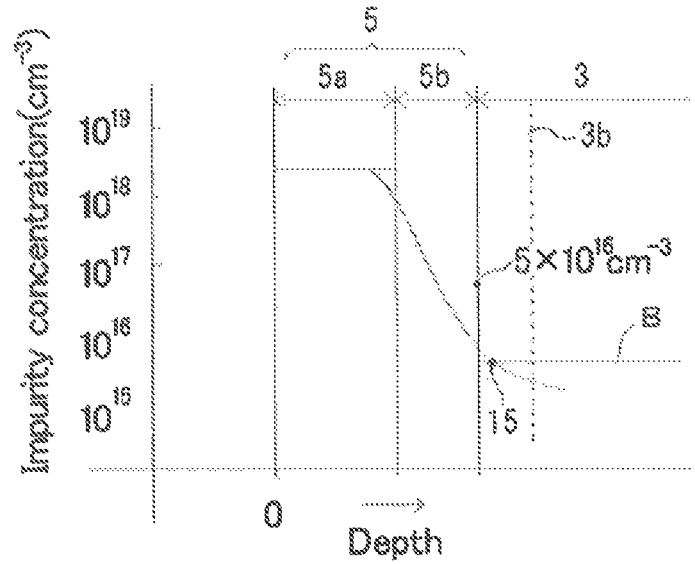
FIG. 3B illustrates the in-depth distribution of impurity concentration in the light-receiving device illustrated in FIG. 3A.

FIGS. 3A and 3B illustrate a modified embodiment of the light-receiving device 10 illustrated in FIG. 1. FIG. 3A is a partially enlarged cross-sectional view of the pixel P. FIG. 3B illustrates the in-depth distribution of the concentration of Zn serving as a p-type impurity. The difference between the modified embodiment and the light-receiving device 10 illustrated in FIGS. 1 and 2 is that a trench K is deepened in such a manner that the bottom of the trench K is located at a position 3b in the light-receiving layer 3. When the trench K is deepened to the light-receiving layer 3, the position of the bottom is located at a position in the light-receiving layer 3 away from the boundary between the concentration adjusting layer 5b and the light-receiving layer 3 by $2/10$ or less of the thickness of the light-receiving layer. As illustrated in FIG. 3A, the deep mesa trench K increases a region where the depth position of the p-n junction 15 lies at a shallower depth than the depth position of the bottom of the mesa trench. In this case, the pixels P can be more surely separated from adjacent pixels.

Figure 4A:
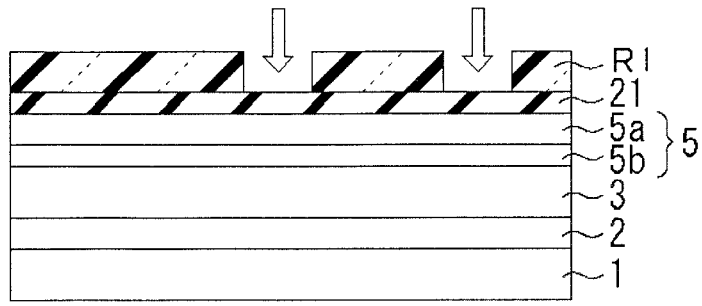
FIGS. 4A to 4D illustrate a process for producing the light-receiving device illustrated in FIG. 1.

A method for producing the light-receiving device 10 will be described below. As illustrated in FIG. 4A, the n-type InP buffer layer 2, the light-receiving layer 3 having a type-II multi-quantum well structure, the concentration adjusting layer 5b including an InP layer and/or an InGaAs layer, and the p-type InGaAs contact layers 5a are grown, in that order, on the InP substrate 1 by an epitaxial growth method to form a stacked semiconductor layer. The light-receiving layer 3 includes a type-II multi-quantum well structure. The concentration adjusting layer 5b includes an InP layer and/or an InGaAs layer. As the epitaxial growth method, for example, a metal-organic vapor phase epitaxy (MOVPE) method using metal-organic compounds for a III group source material and a V group source material may be employed. For example, as a V group source material, tertiarybutylarsine (TBAs) and tertiarybutylphosphine (TBP) are used. TBAs and TBP are source materials of As and P, respectively. In the MOVPE method, low-temperature growth may be performed because the metal-organic sources are decomposed at relatively low temperatures. It is thus possible to inhibit the decomposition and so forth of the type-II multi-quantum well structure during growing the stacked semiconductor layer. Hence, the foregoing semiconductor layers are grown by the MOVPE method to form a light-receiving layer having satisfactory crystallinity. In the MOVPE method, as a p-type-impurity source or the like, a metal-organic source may also be used. For example, diethylzinc (DEZn), which is a metal-organic material, may be used as a Zn source. The growth temperature may be set at a temperature between 425° C. and 575° C. At the growth temperature, the crystallinity of the type-II MQW structure composed of, for example, InGaAs and GaAsSb is not degraded. As the InP substrate 1, an Fe-doped semi-insulating InP substrate is used because of a low optical absorption of the Fe-doped semi-insulating InP in the near-infrared region. Alternatively, a conductive InP substrate may be used, depending on a production process. The impurity concentration in the p-type contact layer 5a is $1 \times 10^{18}$ cm$^{-3}$ or more. The n-type buffer layer 2 is doped with Si at a concentration of $1 \times 10^{18}$ cm$^{-3}$ or more. The concentration adjusting layer 5b may be lightly doped with an n-type impurity or a p-type impurity in a concentration of $1 \times 10^{16}$ cm$^{-3}$ or less. Alternatively, the concentration adjusting layer 5b may not be doped.

Figure 4B:
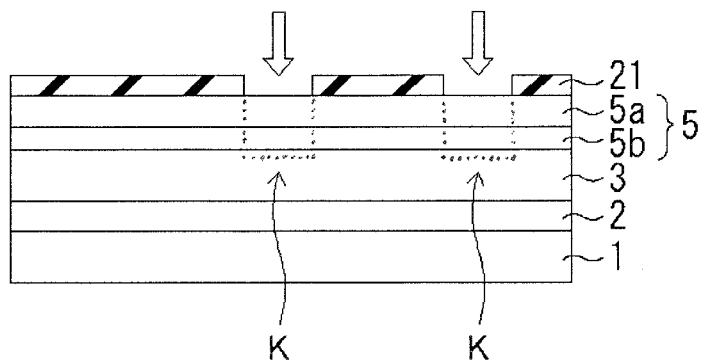

A trench of a mesa structure is formed to separate the pixels P in a pixel region. To form the trench of the mesa structure, an insulating film 21 is formed on the stacked semiconductor layer. The insulating film 21 is formed of, for example, SiO$_2$ or SiN. A mask R1 composed of a resist is formed on the insulating film 21. Arrows in FIGS. 4A and 4B indicate etching positions. The insulating film 21 is etched with buffered hydrofluoric acid using the mask R1 to form an etching mask. As illustrated in FIG. 4B, the stacked semiconductor layer is etched by dry etching using the patterned insulating film 21 as the etching mask. As a result of etching the stacked semiconductor layer, the trench K of the mesa structure is formed in the pixel region. In this dry etching, it is possible to determine the time at which the dry etching is stopped when the bottom of the trench K reaches the upper surface of the light-receiving layer by monitoring antimony in the GaAsSb layer included in the type-II MQW structure. Then the insulating film 21 is removed. As described above, when the depth position of the boundary between the light-receiving layer and the upper layer (the concentration adjusting layer 5b in this embodiment) on the light-receiving layer is defined as the reference depth position, the depth of the trench K of the mesa structure is in the range of (a position in the upper layer away from the reference depth position by $1/10$ of the thickness of the light-receiving layer) to (a position in the light-receiving layer away from the reference depth position by $2/10$ of the thickness of the light-receiving layer). Then a damaged layer is removed by wet etching.

Figure 4C:
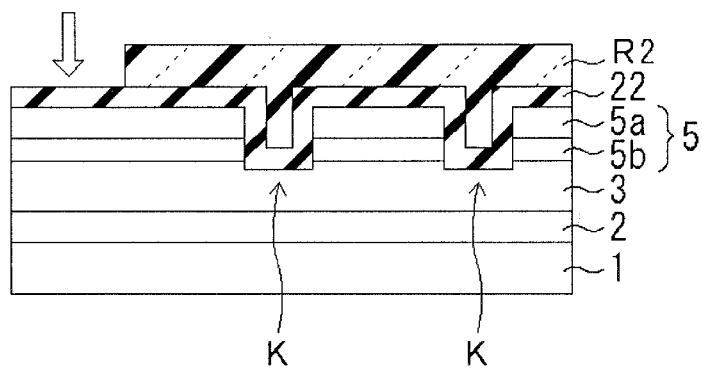
Figure 4D:
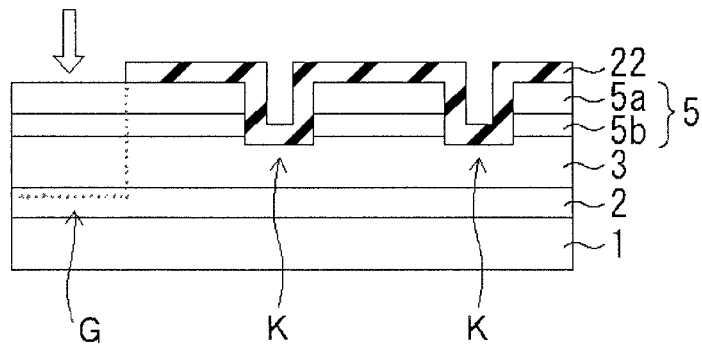

Next, a groove G for the formation of the ground electrode 12 is formed at the edge portion. In this embodiment, the depth of the ground electrode groove G is significantly different from the depth of the trench K for pixel separation. To form the groove G and the trench K, the stacked semiconductor layer is thus etched in two steps. As illustrated in FIG. 4C, an insulating film 22 is formed on the entire surface. The insulating film 22 is formed of, for example, SiO$_2$ or SiN. In the trench K for the pixel separation, side surfaces of the mesa structures are also surely covered and protected. This protection prevents damage to the side surfaces of the mesa structures due to the dry etching, thereby achieving low dark current. A resist mask R2 is formed so as to have an opening at an edge of the light-receiving device 10. As illustrated in FIG. 4D, the ground electrode groove G for the formation of the ground electrode 12 is formed by dry etching. Thereby, the ground electrode groove G is formed at the edge of the light-receiving device 10. In FIG. 4D, the resist mask R2 is omitted.

In FIG. 1 and so forth, the bottom and the inner walls of the trench K and top surfaces of the stacked semiconductor layer are protected by the protective film 25. That is, the side surfaces and upper surfaces of the mesa structures are protected by the protective film 25. Regarding the protective film 25, the insulating film 22 illustrated in FIG. 4D is used, as-is, as the protective film 25.

Next, an annealing process is performed by heating to 400° C. to 550° C. with the bottom and the inner walls of the trench K and top surfaces of the stacked semiconductor layer covered with the protective film 25. Accordingly, the annealing process is performed with the side surfaces and the upper surfaces of the mesa structures covered with the protective film 25. In the annealing process, the p-type impurity (Zn) doped in the p-type contact layer 5a is diffused toward the light-receiving layer 3. In the embodiment, after the mesa structure is covered with the protective film, the p-type impurity is diffused to form the p-n junction 15 at the upper surface of the light-receiving layer 3 or in the light-receiving layer 3. The p-n junction 15 is not exposed to an atmosphere in a growth chamber during the annealing process (in which p-type impurity is diffused). Hence, an impurity, such as oxygen, is not attached to the edge of the p-n junction 15, leading to a reduction in leakage current. Therefore, an increase in the dark current of the light-receiving device 10 can be suppressed.

Next, a mask composed of a resist is formed in order to form the pixel electrode 11. The protective film 25 is etched with the resist mask to form an opening for forming the electrode on the mesa structure. A p-side electrode composed of, for example, AuZn is formed as the pixel electrode 11 by, for example, a lift-off process on the upper surface of the mesa structure. An n-side electrode to be formed into the ground electrode 12 common to the pixels is formed. The n-type electrode may be composed of, for example, AuGeNi. The wiring electrode 13 extending from the ground electrode 12 to the protective film 25 on the mesa structure through a surface of the n-type InP buffer layer 2 and a wall of the stacked semiconductor layer is formed. The backside of the InP substrate 1 is polished to a thickness of about 100 μm. The antireflection (AR) coating 27 as illustrated in FIG. 1 is formed on the backside of the InP substrate 1.

Figure 5:
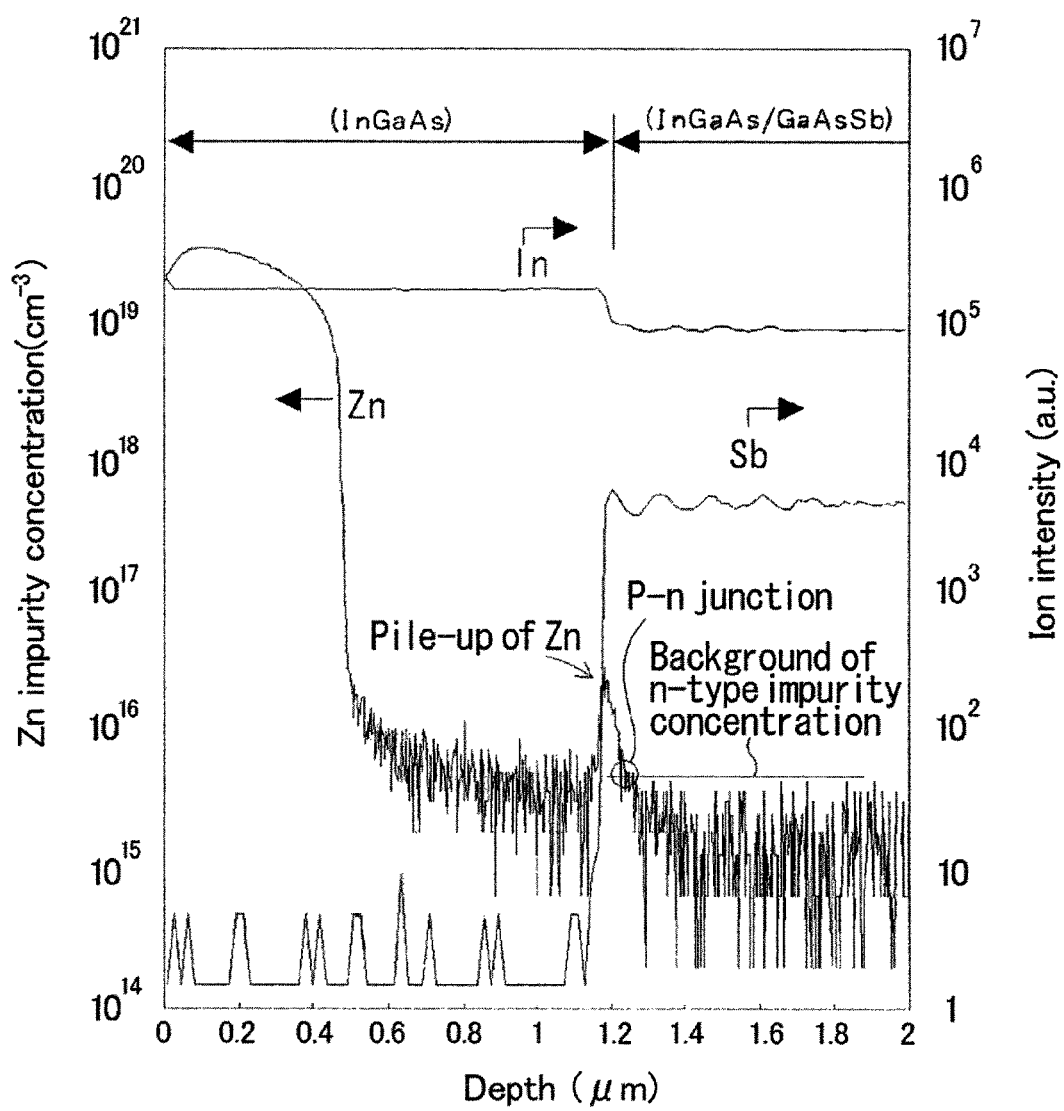
FIG. 5 illustrates the in-depth distribution of Zn obtained by a selective diffusion method in the related art, and, in particular, illustrates the pile-up of Zn at a hetero-interface.

In the embodiment, as a method for forming an impurity region, such as the p-type region 6, the impurity doped in the impurity layer, such as the p-type contact layer 5a is diffused. In addition, the p-n junction 15 is formed by the diffusion of the impurity (Zn) from the impurity layer, such as the p-type contact layer 5a. Here, the impurity (Zn) is doped in the impurity layer during growing the impurity layer. It is thus possible to obtain an impurity concentration distribution different from the case where an impurity is introduced from the outside gas phase. FIG. 5 illustrates the in-depth distribution of Zn obtained by a selective diffusion method in the related art. The in-depth distribution of Zn shown in FIG. 5 is obtained by the selective diffusion method described below. At first, a stacked semiconductor layer including an InP buffer layer, a light-receiving layer, an InGaAs layer, and an InP window layer is formed on an InP substrate. The InP buffer layer, the light-receiving layer, the InGaAs layer, and the InP window layer are grown in this order on the InP substrate by, for example, MOVPE. The InP window layer is a top layer of the stacked semiconductor layer. The light-receiving layer includes a type-II multi-quantum well structure. A selective diffusion mask having openings above the InP window layer is formed to provide an intermediate product (epitaxial wafer). The intermediate product (epitaxial wafer) is vacuum-sealed in a silica tube together with a solid zinc source. The zinc source sublimes by heat treatment. The gas-phase Zn that has sublimed diffuses in desired regions (pixel regions) in the epitaxial wafer from the gas phase through the openings of the selective diffusion mask to form Zn regions. As a result, the in-depth concentration distribution as illustrated in FIG. 5 is obtained when zinc (Zn) is selectively diffused from the outside gas phase through the openings of the selective diffusion mask on the epitaxial wafer.

When a large amount of the diffusion source is present in the gas phase, compared with that in the epitaxial wafer or the light-receiving layer, a small spike-like Zn peak is observed at the heterointerface between InGaAs and the (InGaAs/GaAsSb) type-II multi-quantum well structure, as described as "Pile-up of Zn" in FIG. 5. This is referred to as the "pile-up of Zn".

In contrast, in the embodiment, the method is employed in which the impurity region, such as p-type region 6, is formed using the diffusion from the p-type contact layer 5a containing the p-type impurity (Zn) serving as a diffusion source. In the method according to the embodiment, the pile-up of Zn as illustrated in FIG. 5 does not occur at the heterointerfaces between the concentration adjusting layers 5b and the light-receiving layer 3. Thus, the absence of the pile-up of an impurity (Zn) indicates that the diffusion source of the impurity is the p-type contact layers 5a.

Second Embodiment

Figure 6:
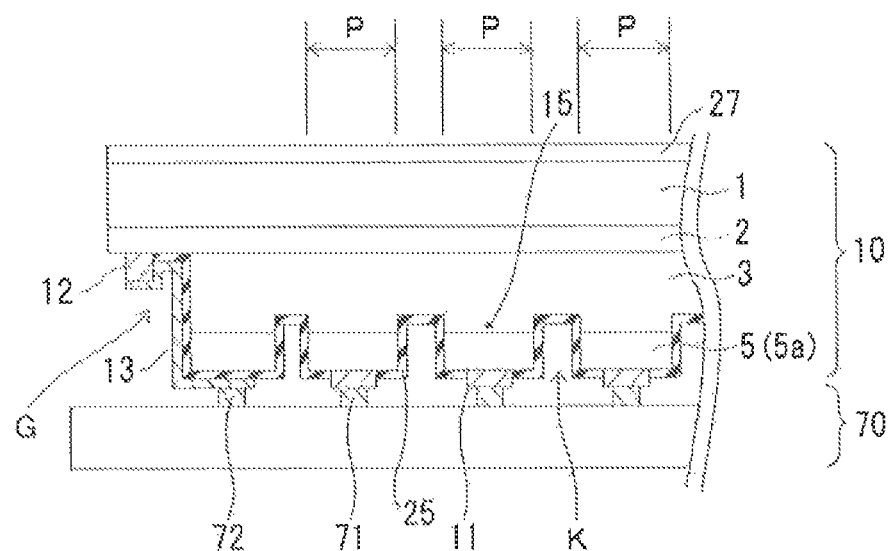
FIG. 6 illustrates a light-receiving device and a sensing apparatus according to a second embodiment.

FIG. 6 illustrates the sensing apparatus 50 in which the light-receiving device 10 according to a second embodiment is connected to the read-out integrated circuit (ROIC) 70. The difference from the light-receiving device 10 according to the first embodiment is that the cap layer 5 is formed of the p-type contact layer 5a alone without the concentration adjusting layer in this embodiment. The bottom of the trench K of the mesa structure is located at a position away from the upper surface of the light-receiving layer 3 by 20% or less of the thickness of the light-receiving layer 3.

Figure 7A:
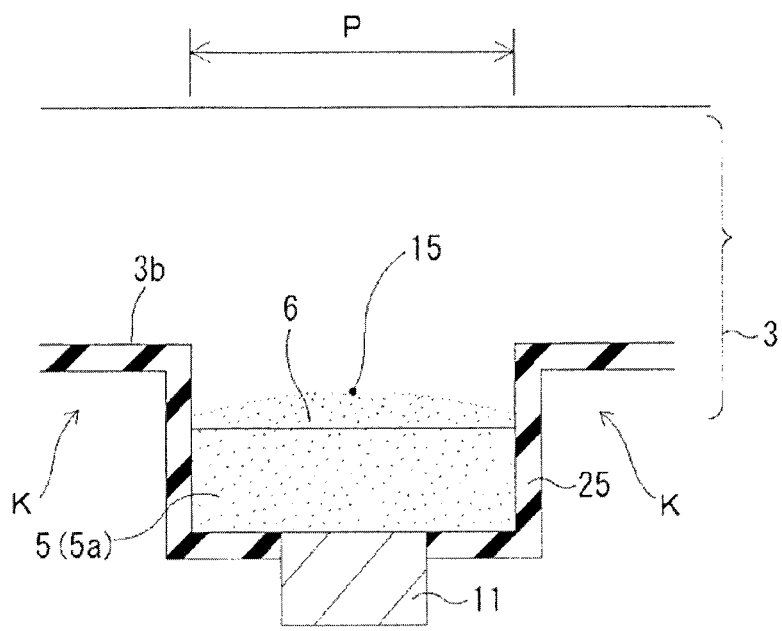
FIG. 7A is a partially enlarged view of a pixel of the light-receiving device illustrated in FIG. 6.
Figure 7B:
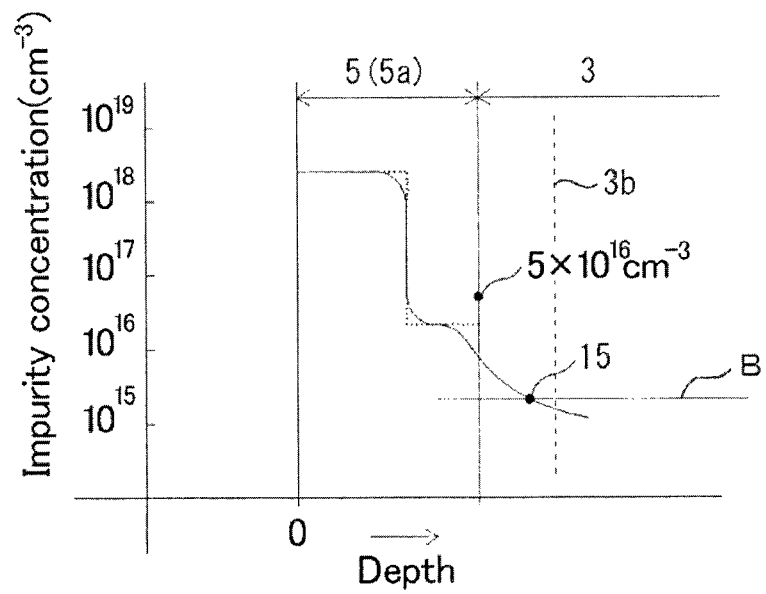
FIG. 7B illustrates the in-depth distribution of impurity concentration in the light-receiving device illustrated in FIG. 6.

FIG. 7A is a partially enlarged view of a pixel P illustrated in FIG. 6. FIG. 7A also illustrates a cross-sectional view of the distribution of Zn serving as a p-type impurity in the pixel P. In the embodiment, the pixels P are mechanically and structurally separated from each other by the trench K of the mesa structure. FIG. 7B illustrates the in-depth distribution of Zn concentration. In the pixel P, zinc (Zn) is directly diffused from the p-type contact layer 5a into the light-receiving layer 3 without a concentration adjusting layer by a driving force resulting from a concentration gradient. The p-type region 6 extends to the light-receiving layer 3. The p-n junction 15 is formed at the end of the p-type region 6. The concentration of the p-type impurity is $5 \times 10^{16}$ cm$^{-3}$ or less at the boundary between the light-receiving layer 3 and the p-type contact layer 5a serving as an upper layer on the light-receiving layer 3, thereby maintaining satisfactory crystallinity of the type-II InGaAs/GaAsSb multi-quantum well structure. However, the p-type contact layer 5a is a region with which the pixel electrode 11 forms an ohmic contact. Thus, at least a surface of the p-type contact layer 5a needs to have a p-type impurity concentration of $1 \times 10^{18}$ cm$^{-3}$ or more. To achieve both the two points concerning the impurity concentration, when the p-type contact layer 5a is epitaxially grown, the doping amount of the p-type impurity may be gradually or stepwise increased from an undoped state or a lightly doped state with the lapse of growth time from the beginning of the growth. For example, as illustrated in FIG. 7B, a step-like concentration distribution indicated by a dotted line may be obtained immediately after the growth of the p-type contact layer 5a by the doping method. In the concentration distribution immediately after the growth, the impurity concentration is $5 \times 10^{16}$ cm$^{-3}$ or less at the boundary between the light-receiving layer 3 and the p-type contact layer 5a.

Hereafter, the p-type impurity exhibiting the step-like concentration distribution is diffused toward the light-receiving layer 3 by annealing. The shape of the step-like concentration distribution immediately after the growth is changed from a rectangular shape to a rounded shape by the diffusion. However, the impurity concentration is not more than $5 \times 10^{16}$ cm$^{-3}$ at the boundary between the light-receiving layer 3 and the p-type contact layer 5a. Thus, there is no degradation in the crystallinity of the type-II multi-quantum well structure due to a high impurity concentration.

Third Embodiment

Figure 8A:
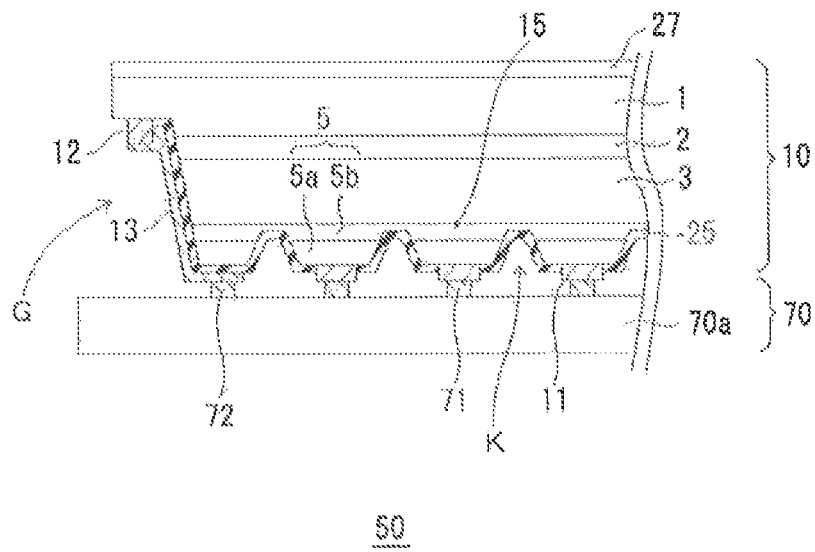
FIG. 8A is a cross-sectional view of a light-receiving device and a sensing apparatus according to a third embodiment.
Figure 8B:
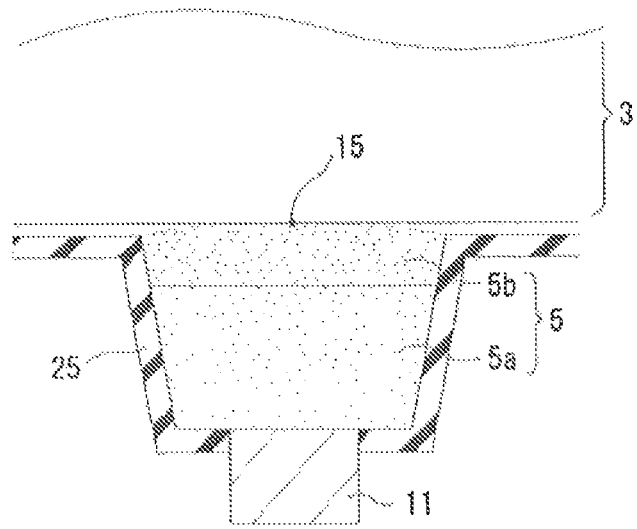
FIG. 8B is a partially enlarged view of a pixel.

FIGS. 8A and 8B illustrate the light-receiving device 10 according to a third embodiment and the sensing apparatus 50 including the light-receiving device 10. FIG. 8A is a cross-sectional view of the sensing apparatus. FIG. 8B is a partially enlarged view of a pixel P. Structures of the light-receiving device 10 according to this embodiment and the sensing apparatus 50 are different from the light-receiving device 10 according to the first embodiment and the sensing apparatus 50 as illustrated in FIG. 1 and so forth in the following points:
(1) walls of the trench K of the mesa structure are inclined. This mesa shape may be obtained by forming the mesa structure by wet etching;
(2) the bottom of the trench K of the mesa structure is located in the concentration adjusting layer 5b of the cap layer 5. The bottom of the trench K is located at a position in the concentration adjusting layer 5b away from the upper surface of the light-receiving layer 3 by 10% or less of the thickness of the light-receiving layer 3; and
(3) the p-n junction 15 is formed at the boundary between the light-receiving layer 3 and the concentration adjusting layer 5b.

The light-receiving device 10 in this embodiment also provides the same advantageous effects as the foregoing first embodiment. The same production method may also be employed, except that the mesa structure is etched by wet etching.

The formation of the trench K and the groove G by wet etching does not substantially cause damage to the crystal. Thus, the removal of a damaged layer by wet etching may not be performed or may be performed.

Fourth Embodiment

Figure 9A:
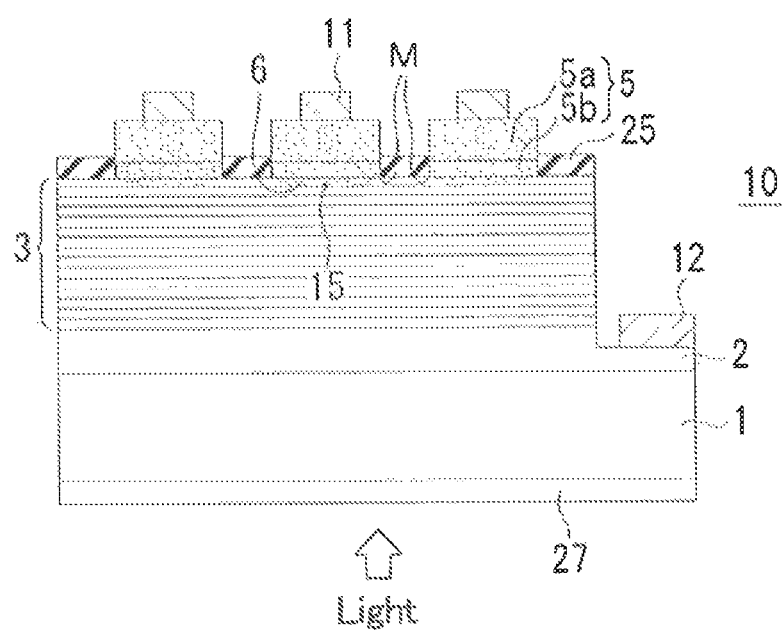
FIGS. 9A and 9B are a cross-sectional view and a plan view, respectively, of a light-receiving device according to a fourth embodiment.
Figure 9B:
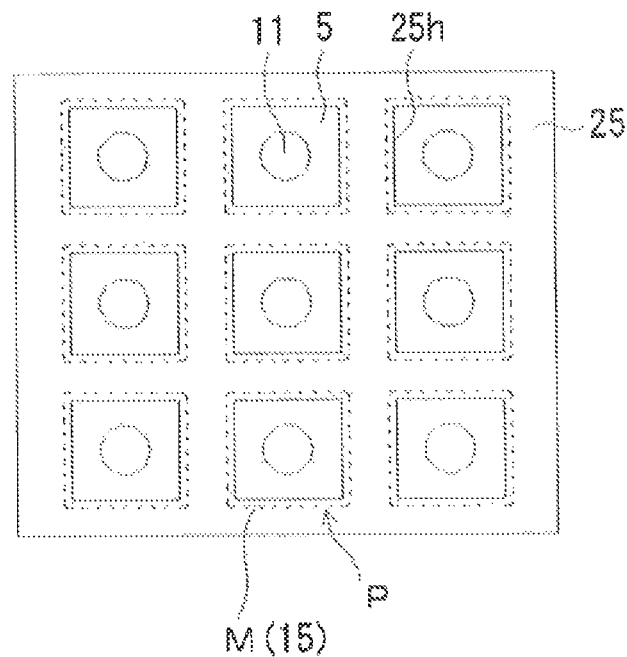

FIGS. 9A and 9B are a cross-sectional view and a plan view, respectively, of a light-receiving device according to a fourth embodiment. A plurality of pixels P are provided on the InP substrate 1. To detect optical signals independently one another, the plural pixels P are separately arranged. Referring to FIGS. 9A and 9B, the light-receiving device 10 has a stacked semiconductor layer described below, (InP substrate 1/buffer layer 2/type-II MQW light-receiving layer 3/cap layer 5).

The n-type buffer layer 2 may be composed of InP, InAlAs, or InGaAs. Light is incident on the backside of the InP substrate 1. To increase the amount of light received, the antireflection coating 27 composed of SiON or a multilayer film is disposed on the backside of the InP substrate 1.

The InP substrate 1 is composed of an Fe-doped semi-insulating InP. The ground electrode 12 is arranged on the n$^+$-type buffer layer 2. The undoped type-II MQW light-receiving layer 3 is grown without intentionally doping any impurities. The type-II MQW light-receiving layer 3 contains an n-type impurity, such as Si, in a concentration of background of $1 \times 10^{16}$ cm$^{-3}$ or less. The cap layer 5 may be composed of InGaAs or InP. The cap layers 5 are selectively grown within openings 25h of the selective growth mask 25. Each of the cap layers 5 includes the p-type contact layer 5a and the concentration adjusting layer 5b. The p-type contact layer 5a in the cap layer 5 is doped with a p-type impurity (for example, Zn). The p-side electrode 11 serving as the pixel electrode is arranged on the p-type contact layer 5a. The p-side electrode 11 is composed of, for example, AuZn. The n-side electrode 12 which is composed of AuGeNi and which serves as the ground electrode is arranged on the n$^+$-type buffer layer 2.

According to the plan view of FIG. 9B, the pixels P are arranged in the respective openings 25h of the selective growth mask 25 in plan. Regarding the arrangement of the pixels P, for example, the pixel pitch is 30 µm. The length of a side of each square opening 25h is 20 µm to 25 µm. The pixel P is a unit of the light-receiving element. As illustrated in FIG. 9B, the pixels P are two-dimensionally arrayed. Thus, for example, imaging may be performed. While the openings 25h have a rectangular or square shape in plan view in the foregoing embodiment, they may have a circular shape or the like.

In this embodiment, the cap layers 5 are selectively grown within the openings 25h of the selective growth mask 25. The mechanical skeleton of the pixels P is formed with the cap layers 5. The selective growth mask 25 is formed so as to be in contact with the light-receiving layer 3. Then the cap layers 5 (5b and 5a) are selectively grown on the light-receiving layer 3 through the openings 25h of the selective growth mask 25 to have a substantially square shape in plan view and thus a post-shape in side view. A semiconductor layer is not grown on the selective growth mask 25. The selective growth mask 25 is composed of, for example, SiN or SiO$_2$. Thus, the cap layers 5 (5b and 5a) are selectively grown in the respective openings 25h. A production method according to this embodiment does not include a step of forming a mesa structure or a step of performing etching a mesa. In the light-receiving device according to this embodiment, gaps between the cap layers 5 correspond to a mesa trench. The skeleton of the pixels P is defined by the cap layers 5 (5b and 5a) confined to the openings 25h.

The formation of a p-n junction according to this embodiment will be described below. The pixel P includes the p-n junction or pi junction to extend a depletion layer to the light-receiving layer 3. Furthermore, the p-n junction is used for separating the pixels P from each other. In this embodiment, when the cap layer 5 (5b and 5a) is epitaxially grown, zinc (Zn) is added as a p-type dopant. The growth temperature is 450° C. or higher. Zn is thermally diffused toward the light-receiving layer 3 during the growth of the cap layer 5. The light-receiving layer 3 contains a low concentration of the n-type impurity as described above. Thus, Zn is diffused from the bottom of the cap layer 5 toward the light-receiving layer 3 while the p-type region 6 is being formed. In this way, the p-n junction 15 may be formed at a position near the upper surface of the light-receiving layer 3 or the boundary between the light-receiving layer 3 and the cap layer 5 (the concentration adjusting layer 5b).

When the light-receiving device is operated, a reverse-bias voltage is applied between the n-side electrode 12 and the p-side electrode 11 to generate an electric field at the p-n junction 15. At this time, in the light-receiving device according to this embodiment, a depletion layer is formed so as to extend from the p-n junction 15 toward a low-impurity-concentration region, i.e., a region containing a low concentration of the n-type impurity. In other words, the depletion layer extends toward the lower surface of the light-receiving layer 3. When light is incident on the backside of the InP substrate 1, light is absorbed in the depletion layer. At this time, electron-hole pairs are efficiently formed in the depletion layer. Among the resulting electron-hole pairs, electrons move to the n-side electrode 12, and the holes move to the p-side electrode 11, thereby accumulating charges in proportion to the amount of light received. Thus, the optical signal is efficiently converted into an electrical signal. The light-receiving device supplies the electrical signal. Providing the electrical signal in response to the intensity of light received for each pixel P results in the intensity distribution of light received, thereby enabling imaging or the like. The separation of the p-n junctions 15 from adjacent pixels P will be described in detail in the section of a production method. In the description, the suppression of dark current will also be described.

Figure 10A:
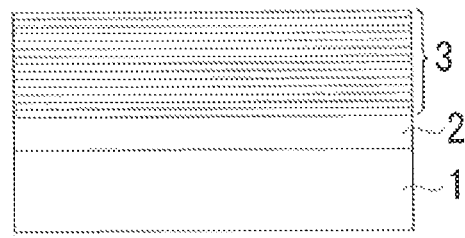
FIGS. 10A to 10D illustrate a process for producing the light-receiving device illustrated in FIG. 9.

FIGS. 10A to 10D schematically illustrate a method for producing the light-receiving device 10 illustrated in FIGS. 9A and 9B. As illustrated in FIG. 10A, the n$^+$-type buffer layer 2 and the undoped light-receiving layer 3 having a type-II MQW structure are grown by an epitaxial growth method on the Fe-doped semi-insulating InP substrate 1. The n$^+$-type buffer layer 2 is composed of, for example, InP, InAlAs, or InGaAs. For the epitaxial growth, for example, a metal-organic vapor phase epitaxy method using only metal-organic sources may be employed with metal-organic compounds for a group III source and a group V source. As Ga (gallium), In (indium), As (arsenic), P (phosphorus), and Sb (antimony) sources, triethylgallium (TEGa), trimethylindium (TMIn), tertiarybutylarsine (TBAs), tertiarybutylphosphine (TBP), and trimethylantimony (TMSb) are used, respectively. As the Ga source, trimethylgallium (TMGa) may also be used. As the In source, triethylindium (TEIn) may be used. As the As source, trimethylarsine (TMAs) may also be used. As the Sb source, triethylantimony (TESb) may also be used. As an n-type dopant, tetraethylsilane (TeESi) may be used. As a p-type dopant, diethylzinc (DEZn) may be used. In the metal-organic vapor phase epitaxy method using only metal-organic sources, a size of a metal-organic vapor molecule in the source is large, and the metal-organic vapor molecule is decomposed at a low temperature to grow a semiconductor layer. Thus, in the metal-organic vapor phase epitaxy method using only metal-organic sources, a semiconductor layer may be grown even at a relatively low temperature. The number of InGaAs—GaAsSb pairs in the MQW structure is in the range of about 50 to 500.

Figure 10B:
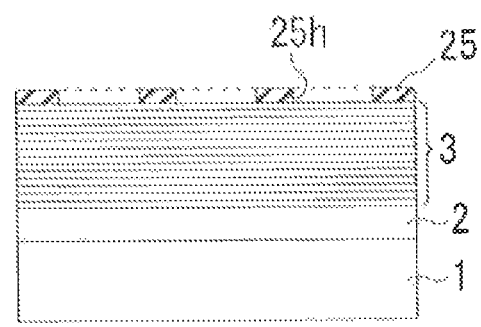
Figure 11:
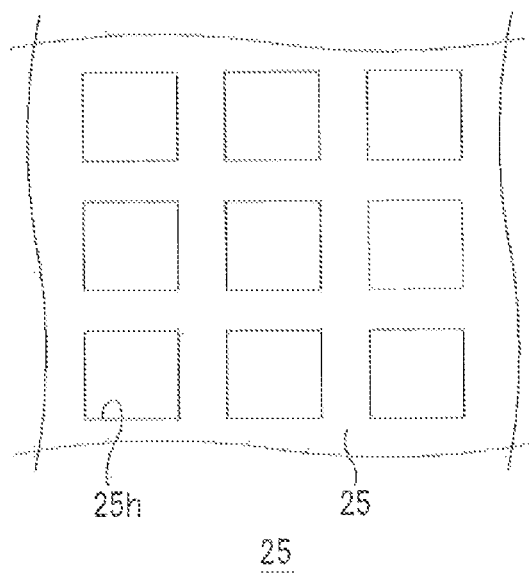
FIG. 11 is a plan view of the opening pattern of the selective growth mask illustrated in FIG. 10B.

Next, the selective growth mask 25 is formed on the light-receiving layer 3. The selective growth mask 25 is formed of a dielectric film composed of, for example, SiN, SiON, or SiO$_2$. FIG. 11 illustrates the pattern of the selective growth mask 25. As described above, the length of a side of each square opening 25$h$ is 20 µm to 25 µm. Each of the longitudinal and transverse pitches of the openings 25$h$ is about 30 µm. The light-receiving layer 3 is exposed through the openings 25$h$ of the selective growth mask 25. Comparing FIG. 11 and FIG. 9B reveals that the openings 25$h$ correspond to central regions of the pixels P in plan. FIG. 10B illustrates a state in which the selective growth mask 25 is formed. Then the cap layers 5 each including the p-type contact layer 5$a$ and the concentration adjusting layer 5$b$ are selectively grown on the light-receiving layer 3 through the openings 25$h$ using the selective growth mask 25. No growth occurs on a region covered with the selective growth mask 25. When the p-type contact layer 5$a$ in the cap layer 5 is formed, for example, diethylzinc (DEZn), which is an organometallic compound, may be used as a dopant source of a p-type impurity. The cap layer 5 including the p-type contact layer 5$a$ and the concentration adjusting layer 5$b$ may be composed of, for example, InGaAs, InP, or a composite layer of InGaAs and InP. The p-type contact layers 5$a$ and the concentration adjusting layers 5$b$ may be composed of the same material or different materials. However, the p-type contact layer 5$a$ is doped with the p-type impurity in a high concentration. On the other hand, the concentration adjusting layer 5$b$ is doped with the n-type impurity or the p-type impurity in a low concentration. Alternatively, the concentration adjusting layer 5$b$ may be not doped (undoped). The presence of the concentration adjusting layers 5$b$ enables the adjustment of the concentration of the p-type impurity that is diffused from the p-type contact layer 5$a$ toward the light-receiving layer 3.

The concentration adjusting layers 5$b$ are selectively grown thorough the selective growth mask 25 on the light-receiving layer 3 exposed at the openings 25$h$. At this time, nothing is grown on a region of the selective mask other than the openings. The growth temperature of the concentration adjusting layers 5b and the contact layers 5$a$ is 450° C. or higher and 550° C. or lower. At the growth temperature, the crystallinity of the type-II MQW structure is not degraded. Furthermore, the satisfactory crystallinity of the selective growth layers, such as the concentration adjusting layers 5$b$, is maintained. Moreover, at the growth temperature, DEZn is decomposed into Zn serving as a p-type impurity. It is thus possible to dope the contact layers 5$a$ with the impurity, Zn, in a high concentration during the growth of the contact layers 5a. In addition, the growth temperature is sufficient to allow the impurity, Zn, with which the contact layers 5$a$ are doped to diffuse from the bottoms of the contact layers 5$a$ into the light-receiving layer 3 while the concentration adjusting layers 5$b$ are changed to a p-type region.

Figure 10C:
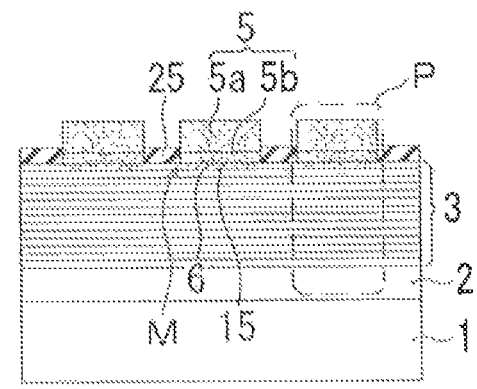
Figure 10D:
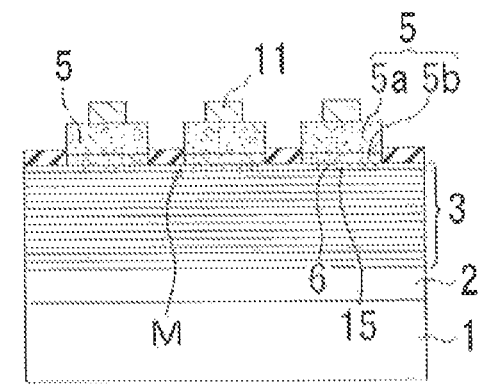

At the foregoing growth temperature, the Zn concentration at a position near the upper surface of the light-receiving layer 3 can be adjusted to about $5 \times 10^{15}$ cm$^{-3}$, which is the background concentration of the n-type impurity in the light-receiving layer 3, by adjusting the thickness of the concentration adjusting layers 5$b$. Thereby, the p-n junction 15 is arranged at a desired position in the light-receiving layer 3. FIG. 10C illustrates a state in which the p-n junction 15 is formed in the light-receiving layer 3. Note that an edge M of the p-n junction is located on the surface of the light-receiving layer 3. The p-type impurity is diffused from the contact layer 5$a$ through the concentration adjusting layer 5$b$ in the thickness direction (depth direction or vertical direction). The p-type impurity is also diffused in the transverse direction (direction along a layer surface). As a result, each of the p-type regions 6 is slightly larger than a corresponding one of the openings 25$h$ in plan.

The edge M of the p-n junction 15 is located on the surface of the light-receiving layer 3. Here, the edge M of the p-n junction 15 is covered with the region of the selective growth mask 25 other than the opening, i.e., the dielectric film. Thus, an impurity, such as oxygen, in the atmosphere is not attached to the edge M of the p-n junction. In FIG. 10C, the range of a pixel P is demarcated by a thick broken line. The range of each p-type region 6 in plan corresponds to a corresponding one of the pixels P. Then the p-side electrode 11 is formed on the p$^+$-type contact layer 5a. The ground electrode (not illustrated) is formed on the n$^+$-type buffer layer 2. This leads to the completion of the light-receiving device 10 illustrated in FIG. 9A. The selective growth mask 25 is left as is in the product because it functions as a passivation film.

Figure 12A:
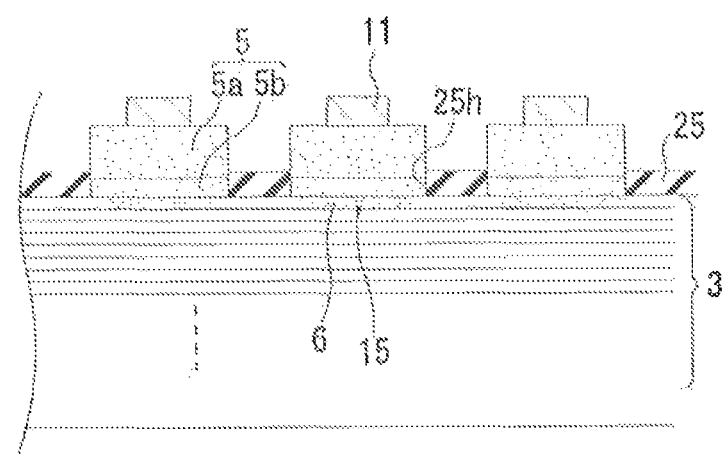
FIG. 12A is a schematic diagram of p-type regions and p-n junctions, the p-type regions extending from selectively grown contact layers serving as diffusion sources.
Figure 12B:
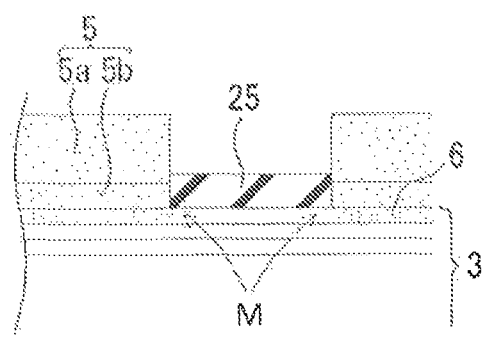
FIG. 12B is a partial enlarged view of edges of the p-n junctions illustrated in FIG. 12A.

Next, dark current of the light-receiving device produced in the production method according to this embodiment will be described. When the edge M of the p-n junction 15 is exposed to the atmosphere, oxygen and so forth in the atmosphere are attached to cause an increase in dark current. It is thus necessary to prevent the edge M of the p-n junction 15 from being exposed to the atmosphere or an atmosphere in a growth chamber even during the production. In this embodiment, as illustrated in FIG. 10C, Zn is diffused from the p+-type contact layer 5*a* to the light-receiving layer 3 through the concentration adjusting layer 5*b*. As illustrated in FIG. 12B, the edge M appears on the surface of the light-receiving layer 3 at the stage in which the p-n junction 15 is formed in the light-receiving layer 3. At this time, the edge M of the p-n junction 15 has already been covered with the dielectric film or the region of the selective growth mask 25 other than the opening. The selective growth mask 25 is left as a passivation film in the light-receiving device, so that the edge M of the p-n junction 15 is not exposed to the atmosphere or the like hereafter. As a result, the edge M of the p-n junction 15 is not exposed to the atmosphere or the atmosphere in the growth chamber, thereby providing the light-receiving device having low-dark-current characteristics.

Regarding the independence of the pixels P, the skeleton of the pixels P is formed with the discrete cap layers 5 as described above. Furthermore, the p-n junctions 15 are separated from the p-n junctions 15 of adjacent pixels P, so that adjacent pixels P are surely and electrically separated from each other. As illustrated in FIG. 12B, the diffusion of the p-type impurity to the transverse direction may be substantially negligible, compared with diffusion in the vertical direction (thickness direction or depth direction). Thus, when a predetermined level of the pitch of the cap layers 5 or the pitch of the openings 25*h* is ensured, adjacent pixels P are surely and electrically separated from each other.

The crystallinity of the light-receiving layer of the light-receiving device produced by the production method according to this embodiment will be described below. When the light-receiving layer has a type-II MQW structure, the MQW structure is not so stable, compared with a bulk crystal. For example, when the type-II MQW structure is processed at a temperature equal to or higher than a predetermined temperature or the type-II MQW structure is heavily doped at a high impurity concentration, the MQW structure may be changed. Alternatively, the layer structure of the MQW structure may be decomposed. With respect to the temperature, the temperature at which the cap layers 5*a* and 5*b* are grown may be set to a relatively low temperature of, for example, 600° C. or lower and even 550° C. or lower. For example, by using the metal-organic vapor phase epitaxy method using only metal-organic sources, a semiconductor layer may be grown even at a relatively low temperature. With respect to the impurity concentration, the thickness of the undoped or lightly-doped concentration adjusting layer 5*b* is adjusted in such a manner that an excess of the p-type impurity is not diffused to the light-receiving layer 3 during the growth of the cap layer 5, in particular, the p-type contact layers 5*a*. In other words, the undoped or lightly-doped concentration adjusting layer 5*b* is used as a layer configured to adjust the diffusion concentration distribution of the p-type impurity. In this case, the concentration of Zn in each concentration adjusting layer 5*b* decreases monotonically from the side of a corresponding one of the contact layers 5*a* (diffusion source) toward the light-receiving layer 3. Note that the pile-up of Zn at the heterointerface does not occur.

With respect to the type-II MQW structure, (InGaAs/GaAsSb), (GaSb/InAs), and so forth may be used. A (InGaAs/GaAsSb) type-II MQW structure is formed on an InP substrate. A (GaSb/InAs) type-II MQW structure is formed on a substrate selected from GaAsSb substrates, GaAs substrates, and InP substrates.

When the concentration adjusting layer 5*b* is provided, the foregoing structure results in a reduction in the concentration of the p-type impurity in the light-receiving layer 3. Unlike the structure according to this embodiment, even when the concentration adjusting layer 5*b* is not provided, a doping method may be employed in which, for example, in the step of forming the p-type contact layer 5*a*, the doping amount of the p-type impurity is gradually or stepwise increased from an undoped state or a lightly doped state with the lapse of growth time. The amount of the p-type impurity diffused toward the light-receiving layer 3 can be adjusted and reduced by the doping method of the impurity in the case of the absence of the concentration adjusting layer. Thus, even in the case of the absence of the concentration adjusting layer, it is possible to form the light-receiving layer 3 having a satisfactory type-II MQW structure with a high crystal quality. Naturally, in the case of the presence of the concentration adjusting layer 5*b*, the foregoing doping method may also be employed. Furthermore, when the selective growth layer is composed of a semiconductor material, such as InGaAs, having a relatively high electrical conductivity even at a low impurity concentration, it is possible to suppress the disadvantage of increasing the electrical resistance or the like even if a layer with a low concentration of the p-type impurity is included in the cap layer 5.

While the embodiments and the examples of the present invention have been described, the disclosed embodiments and examples of the present invention are intended to illustrate and not limit the scope of the invention. The scope of the present invention is defined by the Claims. All changes which fall within meanings and scopes equivalent to the Claims are included.

What is claimed is:

1. A method for producing a light-receiving device, the method comprising the steps of:

growing a light-receiving layer on a substrate, the light-receiving layer having an undoped multi-quantum well structure;

growing on the light-receiving layer, a cap layer including a concentration adjusting layer formed on the light-receiving layer and a p-type contact layer formed on the concentration adjusting layer as a p-type semiconductor layer doped with a p-type impurity as the p-type semiconductor layer is grown, the concentration adjusting layer being undoped or being doped with a p-type or an n-type impurity at a lower concentration than that of the p-type contact layer;

forming a mesa structure including the cap layer by etching the cap layer, the mesa structure being defined by a trench surrounding the mesa structure;

after the step of forming the mesa structure, forming a protective film on an upper surface and a side surface of the mesa structure; and after the step of forming the protective film, annealing the substrate with the protective film covering the upper surface and the side surface of the mesa structure at a predetermined temperature to form a p-n junction in the light-receiving layer or at the boundary between the light-receiving layer and the cap layer, wherein, in the step of forming the mesa structure, the trench reaches the vicinity of an upper surface of the light-receiving layer, and in the step of annealing the substrate, the p-type impurity in the p-type semiconductor layer is diffused from the cap layer in the mesa structure to the light-receiving layer through the concentration adjusting layer.

2. The method according to claim 1, wherein, in the step of growing the cap layer, the p-type semiconductor layer is grown while gradually or stepwise increasing doping with the p-type impurity with the lapse of growth time from the beginning of growth.

3. The method according to claim 1, wherein the light-receiving layer and the cap layer are grown at a growth temperature of 425° C. to 575° C. by a metal-organic vapor phase epitaxy method using metal-organic compounds for a III group source material and a V group source material.

4. The method according to claim 1, wherein the light-receiving layer includes an undoped type-II multi-quantum well structure.

* * * * *